United States Patent [19]

Chou

[11] Patent Number: 5,065,276

[45] Date of Patent: Nov. 12, 1991

[54] TRI-STATE DIP SWITCH

[75] Inventor: Tien-Ming Chou, Taichung, Taiwan

[73] Assignee: Been-Chiu Liaw, Taiwan

[21] Appl. No.: 472,599

[22] Filed: Jan. 29, 1990

[51] Int. Cl.[5] ........................ H05K 7/20; H01H 15/00

[52] U.S. Cl. ................................ 361/380; 200/16 D; 200/252; 200/237; 200/238

[58] Field of Search ............... 200/252, 254, 548, 559, 200/293, 237, 238, 16 D; 361/380, 376, 363; 174/50, 52.4

[56] References Cited

U.S. PATENT DOCUMENTS

| | | | |
|---|---|---|---|
| 4,119,823 | 10/1978 | Matsueda et al. | 200/302 |
| 4,268,728 | 5/1981 | Rose | 200/16 R |
| 4,376,234 | 3/1983 | Liataud et al. | 200/16 R |
| 4,529,851 | 7/1985 | Priebe et al. | 200/16 D |
| 4,628,166 | 12/1986 | Bingo et al. | 200/302.1 |
| 4,670,630 | 6/1987 | Kikta et al. | 200/16 C |
| 4,978,822 | 12/1990 | Billman et al. | 200/302.1 |

*Primary Examiner*—Leo P. Picard
*Assistant Examiner*—Bot Lee Ledynh
*Attorney, Agent, or Firm*—Limbach, Limbach & Sutton

[57] ABSTRACT

The tri-state dual-in-line package (DIP) switch includes a base with a plurality of transverse grooves, a plurality of conducting pins attached to the transverse grooves; a plurality of slide members, each having a top protrusion and one conducting element attached to the rear surface; and a cover having a plurality of openings for the top protrusions of the slide members. The base is tightly sealed to the cover by means of high frequency welding, wherein energy directors provided for in at least one of the base or said cover are melted by allowing high frequency current to pass through the cover to the base. The width of the base is wider than that of prior art and the conducting pins are folded twice to maintain a standard distance.

8 Claims, 5 Drawing Sheets

TRI-STATE DIP SWITCH

BACKGROUND OF THE INVENTION

This invention relates to a dual-in-line package (DIP) switch, more particularly to a DIP switch having three states.

Referring to FIG. 1, a tri-state DIP switch comprises a base 1 with a plurality of transverse grooves 1*a*, a plurality of conducting pins 2, a plurality of conducting elements 3, a plurality of slide members 4, and a cover 5. Each of the conducting pins 2 has a conducting strip on the transverse grooves 1*a* and an extended pointed end folded at the side of the base for connection to an external circuit board. Two of the conducting pins serve as positive and negative input terminals, respectively, for the DIP switch. The plurality of conducting elements 3 are each attached to the bottom surface of one of the plurality of slide members 4. Each slide member 4 rests on one of the grooves 1*a* and has a length equal to that of the base 1. A plurality of thin ⊓ shaped partitions 5*b* are transversely disposed on opposing sides of the plurality of openings 5*a* at the inner top surface of the cover 5, isolating the slide members 4 from each other. The width of the opening of the ⊓ shaped partitions is equal to that of the base 1. Each conducting element 3 can be moved to electrically connect one conducting pin 2 to the positive terminal, the negative terminal, or to a space between the positive and negative terminals of the DIP switch. Each slide member 4 has a top protrusion 4*a*, which protrudes from one of the plurality of openings 5*a* formed on the cover 5.

A main drawback of this structure is that the cover 5 is joined to the base 1 only by structural means, i.e., the base 1 has a pair of elongated slots formed on its shorter sides and the cover 5 has its shorter sides formed with recessed ends for receiving the elongated slots of the base 1. Thus, the base 1 is not tightly sealed to the cover 5.

SUMMARY OF THE INVENTION

Therefore, the object of this invention is to provide a tri-state DIP switch, wherein the base is tightly sealed to the cover.

More specifically, the object of this invention is to provide a DIP switch wherein the cover and the base can be welded together through the use of high frequency welding.

A further object of this invention is to provide a DIP switch wherein at least one of the cover or the base comprises energy directors, the cover being welded to the base by using high frequency welding to melt the energy directors.

Accordingly, the DIP switch of this invention comprises a base with a plurality of transverse grooves; a plurality of conducting pins embedded to the base, with each having a conducting strip resting on the transverse grooves on one end and a pointed end for connection to an external circuit board; a plurality of slide members, each having a top protrusion and one conducting element attached to the rear surface; and a cover having a plurality of openings for the top protrusions of the slide members. The cover further comprises energy directors. The base further comprises longitudinally disposed slots for temporarily receiving the energy directors prior to welding. During the high frequency welding process, the current passing from the cover, through the energy directors to the base, melts said energy directors and effectively seals said cover to said base.

The absence of the ⊓ shaped partitions disclosed in the prior art makes the width of the base of this invention wider. In order to maintain a standard distance between the pointed ends of the conducting pins on the two opposing sides of the base, the pointed ends of the conducting pins are folded twice to lessen the initial distance between the conducting pins.

BRIEF DESCRIPTION OF THE ACCOMPANYING DRAWINGS

Other features and advantages of this invention will become apparent in the following detailed description of the preferred embodiment of this invention, in which.

DETAILED DESCRIPTION OF THE PREFERRED EMBODIMENT

Figure 1:
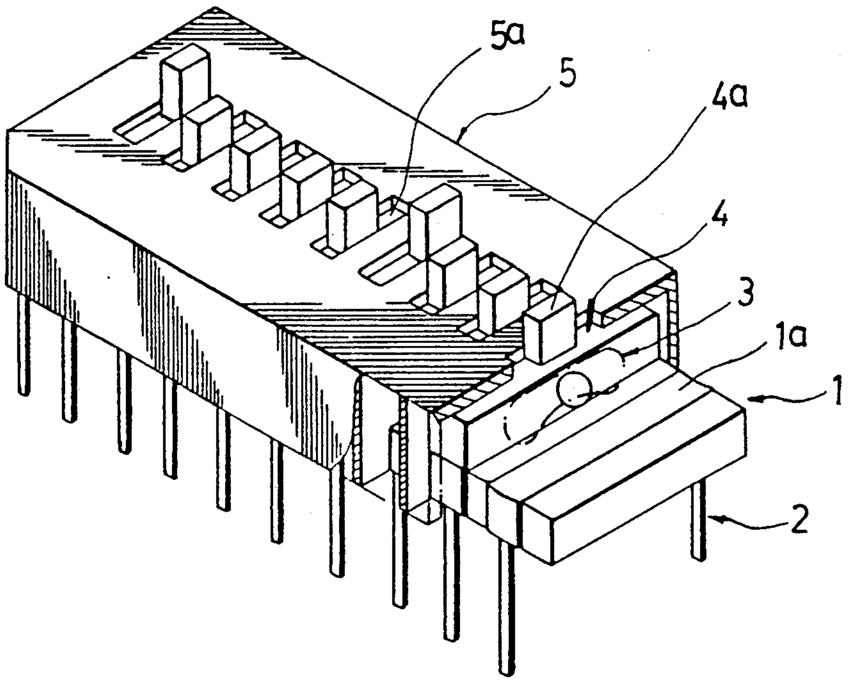
FIG.1 PRIOR ART
FIG. 1 is an illustration of prior art.
Figure 2:
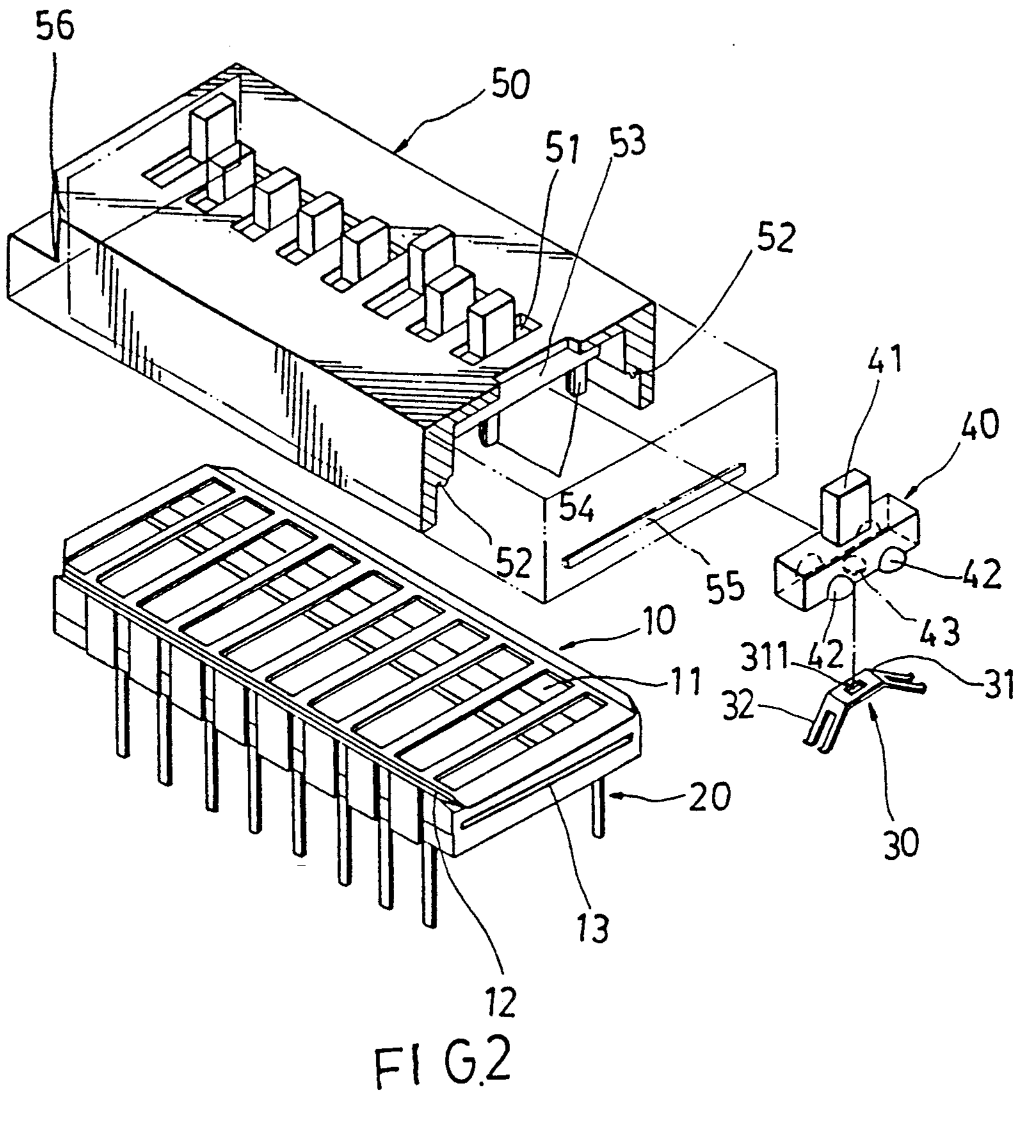
FIG. 2 is an exploded perspective view of a DIP switch according to this invention.

Referring to FIG. 2, an exploded perspective view of the preferred embodiment is shown. The dual-in-line package (DIP) switch of this invention comprises a rectangular base 10, a plurality of conducting pins 20, a plurality of conducting elements 30, a plurality of slide members 40, and a rectangular cover 50. The base 10 has a plurality of equally spaced and transversely disposed rectangular grooves 11. The transverse grooves 11 have portions near the peripheral sides of the base 10 submerged into the material of said base 10, forming flat peripheral portions on the same, and a pair of substantially V-shaped slots 12 longitudinally disposed on the flat peripheral portions. An elongated slot 13 is formed at each of the two shorter sides of the base 10.

Figure 4:
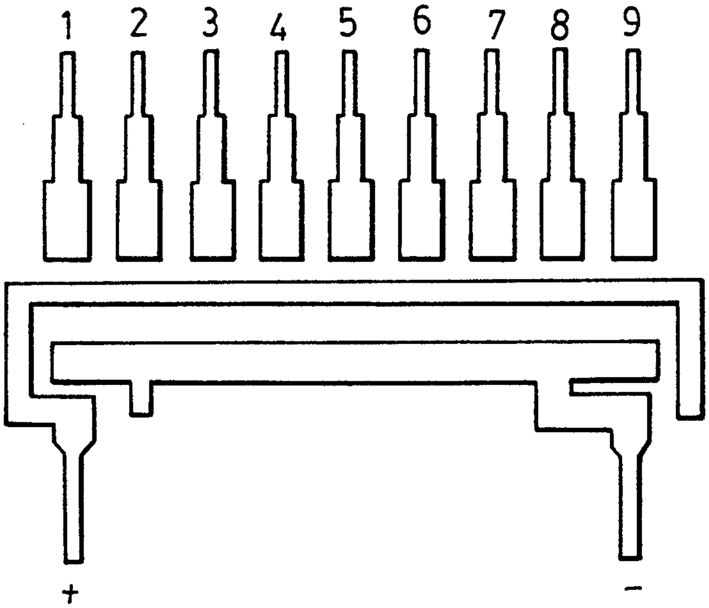
FIG. 4 is an illustration of the pin arrangement of a DIP switch according to this invention.

Two of the plurality of conducting pins 20 each have a longitudinally disposed conducting strip embedded inside the base 10 and electrically connect the grooves 11 of the base 10. The conducting strips are spaced from each other. The two conducting pins serve as positive and negative input terminals of the DIP switch. The rest of the plurality of conducting pins 20 each have a conducting strip transversely disposed and embedded inside the base 10 and on the transverse grooves 11. The plurality of conducting pins 20 each has an outwardly extending pointed end which is first folded at the peripheral portions for submerging into the base 10 and extending along the side and rear surfaces of the same, and again folded downwards for connection to an external circuit board. The folded portions of the conducting pins are received by a plurality of grooves formed on the side and rear surfaces of the base 10. The double fold is to maintain a standard distance between the positive and negative input terminals of the DIP switch and the rest of the conducting pins 20. FIG. 4 shows a schematic representation of the arrangement of the conducting pins 20 on the base 10.

Each conducting element 30 comprises a square pan 31 with a central hole 311 and four conducting legs 32 extending longitudinally and inclining downwardly from the corners of the pan 31. Each of the conducting elements are respectively received by the transverse grooves 11 of the base 10.

Figure 5A:
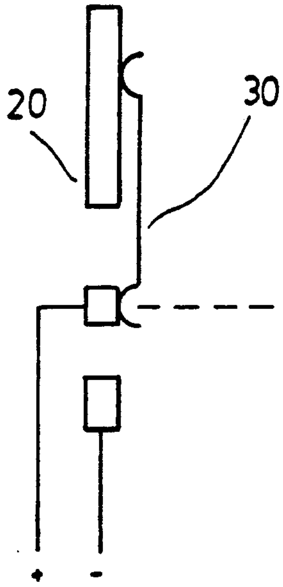
FIGS. 5A, 5B, 5C illustrate three switching states of a DIP according to this invention.
Figure 5C:
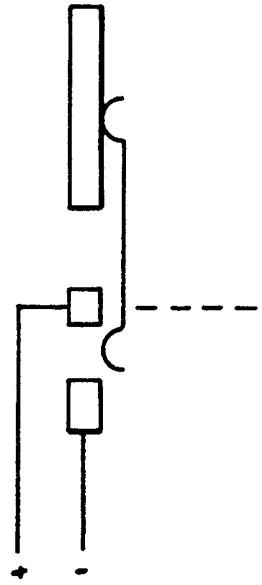
Figure 5B:
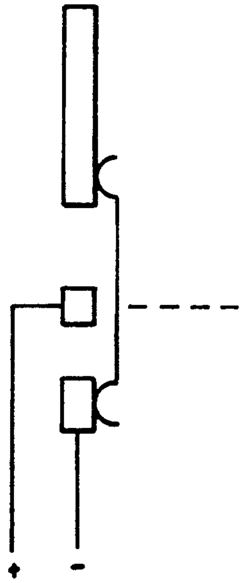

Each slide member 40 is shaped as a rectangular block having a top protrusion 41 and a bottom face protrusion 43 to engage with the central hole 311 of one conducting element 30. The length of each slide member 40 is less than the length of the transverse groove 11. Each slide member 40 cooperates with one conducting element 30 in such a way that movement of the slide member 40 will cause the conducting element 30 to electrically connect one conducting pin 20 to either the positive input terminal or the positive ON state as shown in FIG. 5A, the negative input terminal or the negative ON state as shown in FIG. 5B, or to a space between the conducting strips of the positive and negative input terminals or the OFF state as shown in FIG. 5C. A plurality of protrusions 42, each having a shape similar to a quadrant of a sphere, are formed at the sides near the bottom edges of each rectangular block.

The rectangular cover 50 comprises a plurality of rectangular openings 51, equal in number to the plurality of transverse grooves 11 of the base 10, and a longitudinal inner step shoulder formed on two opposing sides of the cover. An energy director 52, shaped as an elongated V-shaped protrusion, is formed on each inner step shoulder. Each energy director 52 is received by the substantially V-shaped slot 12 and serves as a welding point when joining the base 10 to the cover 50. The cover 50 is welded onto the base 10 by high frequency current passing from the cover 50 through the energy director 52 to the base 10, melting the energy director 52 and thereby completely sealing the cover 50 to the base 10. The cover 50 further comprises a plurality of dividers 53, which are transversely disposed on opposing sides of each of the plurality of openings 51 at the inner top surface of the cover 50. Each divider 53 has two axially and downwardly extending vertical posts 54 extending towards said base 10, and so arranged that when the preferred embodiment is assembled, the vertical posts 54 help guide the sliding members 40 to move from one switching state to another. The cover 50 further comprises a bevelled edge 56 which is formed during the manufacturing of the cover 50. An elongated protrusion 55 is formed on the inner surface of the shorter sides of the cover 50. The protrusions 55 are received by the elongated slots 13 of the base 10 when said base 10 is joined to the cover 50.

Figure 3:
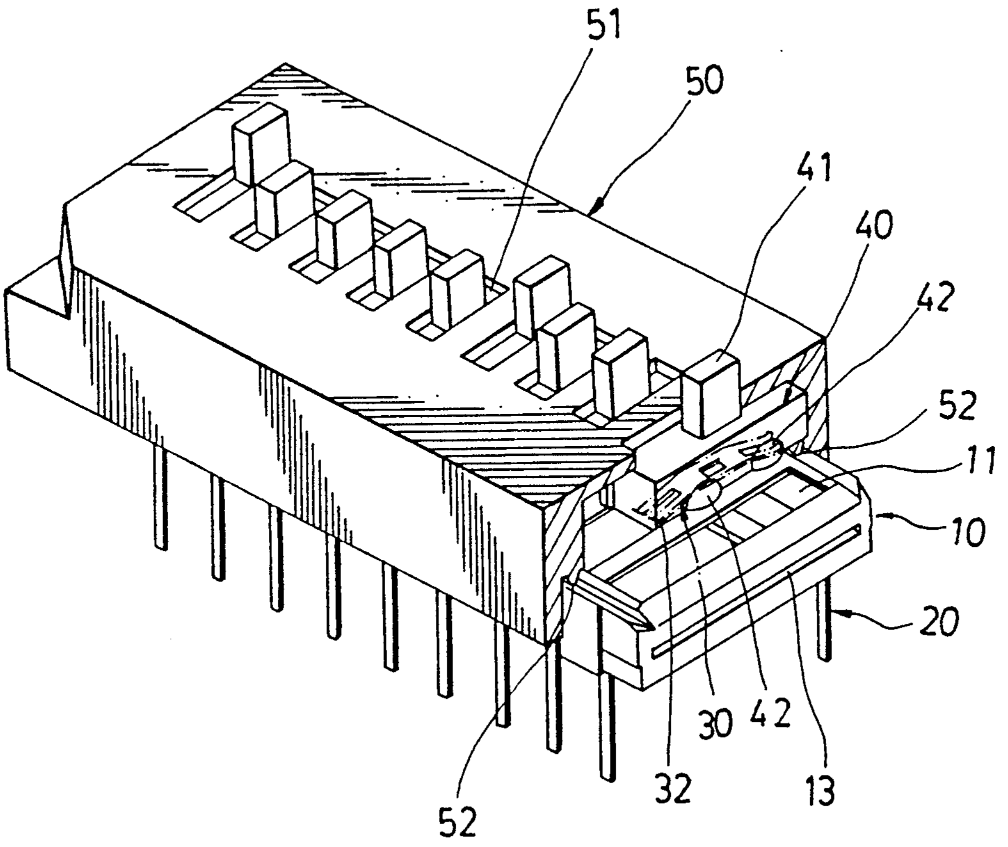
FIG. 3 is a perspective view of the DIP switch of FIG. 2.

FIG. 3 shows the preferred embodiment in its assembled form. The protrusion 41 of the sliding member 40 protrudes from the openings 51 of the cover 50. The plurality of protrusions 42 prevents the slide member 40 from resting directly on the transverse groove 11, but allows the plurality of conducting legs 32 of the conducting element 30 to contact said transverse groove 11.

Although this embodiment employs this arrangement of the substantially V-shaped slot 12 and the energy director 52, this invention should not be limited thereto. The energy director 52 can be made a part of the base 10 and the substantially V-shaped slot 12 may be made a part of the cover 10.

While the present invention has been described in connection with what is considered the most practical and preferred embodiment, it is understood that this invention is not limited to the disclosed embodiments, but is intended to cover various arrangements included within the spirit and scope of the broadest interpretation so as to encompass all such modifications and equivalent arrangements.

We claim:

1. A multi-state dual-in-line package (DIP) switch which includes:

a base having a plurality of transverse grooves;

a plurality of conducting pins attached to said base, at least two of which serves as a first state and a second state input terminal, respectively, said plurality of conducting pins each having one end adapted for connection to an external circuit board and another end forming a conducting strip on said plurality of transverse grooves;

a plurality of slide members for allowing said conducting pins to contact with said first and second state input terminals, each said slide member having a protrusion as its top;

a cover, to be engaged with said base, having a plurality of openings for receiving the outwardly extending portion of said protrusion of said plurality of slide members, said cover comprising a plurality of dividers transversely disposed on opposing sides of each of said plurality of openings at the inner top surface of said cover, and a plurality of axially and downwardly extending vertical posts extending from each said divider towards said base, whereby said vertical posts guide said sliding members moving from one switching state to another, wherein said base further comprises peripheral edges which are transverse to said plurality of transverse grooves to provide a welding surface for connecting said base to said cover; and a plurality of conducting elements, each said conducting element comprising a pan with a central hole and a plurality of conducting legs extending longitudinally and inclining downwardly from said pan, each said slide member further comprising a bottom face protrusion adapted to engage with said central hole of said pan and a plurality of bottom side protrusions for preventing each said slide member from resting directly on said transverse grooves, while allowing said plurality of conducting legs of one said conducting element to contact one said transverse groove.

2. A multi-state DIP switch as claimed in claim 1, wherein said base is welded to said cover by means of high frequency welding.

3. A multi-state DIP switch as claimed in claim 2, wherein at least one of said peripheral edges transverse to said plurality of transverse grooves of said base and the corresponding portions of said cover further comprise longitudinally disposed energy directors shaped as an elongated protrusion, said energy directors being melted during high frequency welding.

4. A multi-state DIP switch as claimed in claim 3, wherein at least one of said cover or said base further comprise longitudinally disposed slots opposite said energy directors for temporarily receiving said energy directors prior to the welding process.

5. A multi-state DIP switch as claimed in claim 1, wherein said end of each said conducting pin adapted for connection to an external circuit board comprises an outwardly extending pointed end which is first folded at said peripheral portions for submerging into said base and extending along the side and rear surfaces of said base, and again folded downwards for connection to an external circuit board.

6. A multi-state DIP switch as claimed in claim 5, wherein said base further comprises a plurality of grooves formed on the side and rear surfaces for receiving said folded portions of said conducting pins.

7. A multi-state DIP switch as claimed in claim 1, wherein said slide members have a length which is smaller than said transverse groove.

8. A multi-state dual-in-line package (DIP) switch which includes:

a base having a plurality of transverse grooves;

a plurality of conducting pins attached to said base, at least two of which serves as a first state and a second state input terminal, respectively, said plurality of conducting pins each having one end adapted for connection to an external circuit board and another end forming a conducting strip on said plurality of transverse grooves;

a plurality of slide members for allowing said conducting pins to contact with said first and second state input terminals, each said slide member having a protrusion at its top; and a cover, to be engaged with said base, having a plurality of openings for receiving the outwardly extending portion of said protrusion of said plurality of slide members;

wherein said base further comprises peripheral edges which are transverse to said plurality of transverse grooves to provide a welding surface for connecting said base to said cover, said base and said cover each having a pair of corresponding shorter sides, wherein said base further comprises an elongated slot formed at each of said shorter sides of said base, and said cover further comprises an elongated protrusion formed at each of said shorter sides of said cover, said elongated protrusions being received by said elongated slots when said cover is joined to said base.

* * * * *